US006351079B1

(12) United States Patent
Willis

(10) Patent No.: US 6,351,079 B1
(45) Date of Patent: Feb. 26, 2002

(54) LIGHTING CONTROL DEVICE

(75) Inventor: Charles Henry Hurst Willis, Doncaster (GB)

(73) Assignee: Schott Fibre Optics (UK) Limited, Doncaster (GB)

( * ) Notice: Subject to any disclaimer, the term of this patent is extended or adjusted under 35 U.S.C. 154(b) by 0 days.

(21) Appl. No.: 09/478,395

(22) Filed: Jan. 6, 2000

(30) Foreign Application Priority Data

| | | |
|---|---|---|
| Aug. 19, 1999 | (GB) | 9919608 |
| Nov. 20, 1999 | (GB) | 9927366 |

(51) Int. Cl.[7] .............. H01L 33/00
(52) U.S. Cl. .............. 315/200 A; 315/291; 362/800
(58) Field of Search .............. 315/224, 225, 315/291, 307, 209 R, 200 A, 200 R, 185 R, 185 S, 360; 362/800

(56) References Cited

U.S. PATENT DOCUMENTS

| | | | | |
|---|---|---|---|---|
| 5,278,432 A | * | 1/1994 | Ignatius et al. | 362/800 |
| 6,095,661 A | * | 8/2000 | Lebens et al. | 315/291 |
| 6,160,596 A | * | 12/2000 | Sylvester et al. | 362/29 |
| 6,161,910 A | * | 12/2000 | Reisenauer et al. | 315/224 |

* cited by examiner

*Primary Examiner*—Don Wong
*Assistant Examiner*—Wilson Lee
(74) *Attorney, Agent, or Firm*—Louis J. Franco

(57) ABSTRACT

A lighting device and control means therefor is disclosed. The lighting device consists of a plurality of White LEDs (WLEDs) provided in separate chains all connected parallel. A small number of WLEDs is connected in series in each chain, and a number of such chains are wired together in parallel between a pair of voltage lines from which current is drawn. Current measurement and adjusting means is provided firstly between a high voltage line and all the parallely connected chains, and secondly in each chain. Each current measurement and adjusting means is controlled ideally by a microprocessor which monitors both the total current drawn by all the chains together and also the individual currents flowing in each chain. WLEDs have a tendency to fail when subjected to sudden current increases, and also when operating at extreme temperatures as temperature affects the operating characteristics of diodes in general. It cannot however accurately be predicted whether a particular WLED will fail in open or closed circuit and the invention provides a means of mitigating the effect of failure of one WLED on those which remain functioning in the circuit. The control means immediately increases or reduces the total current flow to all the chains depending on whether a WLEDs fails in short or open circuit. The control means also detects operating temperature and user light intensity requirement and adjusts various currents accordingly.

18 Claims, 3 Drawing Sheets

LIGHTING CONTROL DEVICE

CLAIM OF FOREIGN PRIORITY

This Application claims foreign priority benefits under Title 35, United States Code, Section 119 based on British Patent Application Number 9919608.1 filed in the United Kingdom on Aug. 19, 1999 and British Patent Application Number 9927366.6 filed in the United Kingdom on Nov. 20, 1999.

BACKGROUND

This invention relates to a lighting control device, and more specifically to a control device adapted for use in conjunction with arrays of white light emitting diodes, hereinafter referred to as WLEDs. In particular, the invention hereinafter described has particular application in the field of dedicated aircraft seat lighting, as WLEDs are beginning to replace the fiber optic lighting systems that are currently in widespread use.

British Patent Application No. 2317421 describes a modular aircraft seat lighting arrangement comprising a plurality of fiber optic cables, ends of which are grouped together in a so-called common end which is illuminated by a high intensity light source, the alternate ends known as fiber optic tails being used to transfer light from the light source to a plurality of different locations. The individual fiber optic cables that connect the tails and the common ends are often bulky and cumbersome, and are thus integrally disposed within or underneath the seats for which they are adapted to provide illumination.

This arrangement does represent a significant advance over the conventional aircraft seat lighting arrangement in which individual lights are incorporated in a mass-produced console unit above each passenger seat on the aircraft, because the fiber optic tails can be sheathed in a flex and stay type member and thus the occupant of a seat can move the tail to any desired position. However, the fiber optic seat-lighting arrangement has a number of disadvantages. For instance, the apparatus is bulky. When one considers that modern aircraft have seats arranged in banks of three, and a lighting arrangement is generally provided within or underneath each bank of seats, it can be appreciated that the increase in overall weight of the aircraft is significant, especially in larger aircraft that may have seating for over 400 passengers, for example.

A further disadvantage of the fiber optic lighting arrangement is its power consumption, which is relatively high on account of the requirement to power the high intensity lights that illuminate the common ends of the cables.

The recent introduction and customer acceptance of WLEDs has given rise to the development of WLED lighting systems for aircraft, as it is the current belief that WLED systems will displace fiber optic lighting arrangements from their dominant position within the field of aircraft seat lighting. However, the use of WLEDs has heretofore been impeded by their proclivity towards failure, which is generally greater than the proclivity of conventional LEDs to fail. Additionally, LEDs whether WLEDs or otherwise and being essentially diodes can fail in either short circuit or open circuit, an therefore some contingency is required to be factored into any device which depends on the correct functioning of the LEDs or WLEDs to provide light in a particular area. Furthermore, the failure probabilities of WLEDs and LEDs are much higher than the high intensity light sources currently used in the fiber optic lighting arrangements, and therefore some contingency is crucial.

The applicant has realized that a cluster arrangement of WLEDs having a plurality of WLEDs therein would provide sufficient contingency against total failure of the light because it would be very unlikely for all the WLEDs in the cluster to fail during a single use. Furthermore they have also realized that at least some of the WLEDs within the cluster must be connected in parallel because the open circuit failure of a single WLED if all were connected in series would result in total failure of the light.

The use of WLEDs has also been previously impeded by the electronic and physical sensitivity of such components. For instance, WLEDs are highly temperature and current sensitive devices, and a slight increase in the operating temperature or electric current being passed can dramatically reduce the life expectancy of the device. It should also be mentioned that diodes being semi-conductor devices have complex temperature dependent resistance, and thus voltage and current characteristics.

A further difficulty associated with the provision of uniform intensity light with WLEDs is that the voltage supplies on aircraft and within vehicles are often non-uniform. The electrical sensitivity of WLEDs and their increased likelihood of failure during the occasional power surges which may be experienced gives rise to the need for some form of compensation to ensure that the working life of the WLEDs is prolonged as much as possible.

SUMMARY

Although the following invention is described primarily with particular reference to the lighting of individual aircraft seats, it is to be understood that the applications for embodiments of the invention are not so limited. WLED clusters can be used in any environment where illumination of a particular and discreet area is required, and where there is furthermore a requirement for user flexibility and versatility inasmuch as the lighting arrangement be capable of adopting a number of positions and orientations with respect to its mounting. Such lighting arrangements are particularly suited to providing reading lighting to the occupant of a seat.

One advantage of the present invention is that it provides a device for monitoring and controlling the operation of a lighting device including a cluster of WLEDs. The monitoring and controlling device ensures safe and uninterrupted operation of the lighting device and can compensate for changes in the operating characteristics of the cluster of WLEDs and for failure of one or more WLEDs during operation.

In one embodiment, a lighting device comprises a cluster of WLEDs, at least some of which are chained in parallel between a pair of lines that apply a voltage across the WLEDs chains. Each WLED chain has at least one WLED therein, characterized in that first current altering means and second and further current altering means are also provided between the lines, said first current altering means being capable of adjusting the total current drawn from the voltage lines by the chained WLEDs and the second and further current altering means being provided in at least one of the chains to adjust the particular current through said chain.

In one version, primary current measuring means are also provided between the voltage lines and the chains for measuring the total current being drawn by all the WLED chains.

In another version, each of the WLED chains is provided with secondary current measuring means which communicate with a control means (e.g., a microprocessor operating under the control of a computer program). The control means adjusting the current flow through the WLEDs depends, for example, on a comparison between the measured current through each WLED chain individually and, optionally, through the first current altering means.

In one implementation, three WLEDs are connected in series in each WLED chain. One advantageous configuration includes 6 chains including three WLEDs each so that the WLED cluster comprises 18 WLEDs.

In various embodiments, the current-measuring means comprises a resistor connected in series with the series-connected WLEDs in each chain and, furthermore, the first and second current altering means comprise transistors.

It is advantageous for the device to be further provided with temperature measurement means that also communicate with the control means that adjust the current flow through the WLED chains accordingly.

It is advantageous, in one or more embodiments, to provide control means that dynamically adjust the current flows through the WLED chains such that the current flow therethrough is substantially uniform and is devoid of discontinuities regardless of the operating temperature and/or the failure of one or more of the WLEDs.

In various embodiments, the control means, voltage lines, and chained series-connected WLEDs are integrated on a single circuit.

One use for which various embodiments are particularly suited is providing light for a passenger seat in an aircraft, for example. Such seats often have built-in power sources, and in such cases, it is envisioned that the device would be powered by said in-built power source.

In various embodiments, the control means also communicates with an indication means to change the state of the indication means when the control means recognizes that one or more of the WLEDs has failed. In one or more versions, an indication means comprises a light means that emits light other than white. The light means is provided in series with gate means that are also in communication with the control means between the lines. The control means activates the gate means, thus allowing current to flow through the light means to illuminate the light means only when one or more of the WLEDs has failed.

It is advantageous to mount the light means in proximity to the WLEDs so that, when a WLED has failed and the array of WLEDs is viewed, the illuminated light means is visible to the observer.

In a specific configuration, the WLEDs and the optional indication means are mounted proximate one another in hexagonal close packed arrangement on a circuit board. In such an arrangement, it is advantageous to mount the control means in the circuit board as well.

In another illustrative version, the WLEDs are connected within the circuit in groups of three WLEDs, the WLEDs of each group being connected in series as a single chain. Each three-WLED chain is connected in parallel with the other WLED chains.

It is advantageous for the grouping of the WLEDs in threes to be such that any single WLED is adjacent one other WLED with which it is connected in series. With such a configuration, the open circuit failure of any one of the WLEDs (resulting, for example, in the extinction of the remaining two WLEDs connected in series therewith in a particular chain) could be automatically compensated for without significant directional imbalance of light emission from the device.

In various embodiments, the WLEDs and optional indication means are mounted on an integrated circuit board comprising wiring and to which said control means is additionally mounted. The integrated circuit board is to be considered an independent and separately claimable aspect of this invention. Alternatively, the indication means may be provided in a remote indicator panel and directly powered from the control means. In still another alternative version, the indicator means may be simply one or more bits in a memory register that is interrogable by a suitably equipped engineer, for example.

According to a further aspect of the invention, a control means is provided for controlling current flow through a plurality of WLED chains connected in parallel between a pair of voltage lines. Each WLED chain has at least one WLED connected therein. Additionally, current altering means are connected in each chain and current measuring means are also provided in each chain that communicate with the control means, characterized in that the current flow through each of the chains is altered dependent upon a comparison effected by the control means of the current flows through each of the plurality of chains such that the said current flows are maintained substantially uniform.

In a preferred aspect, at least a single current altering means, and optionally current measurement means are provided between all of the chains and one of the voltage lines which are capable of altering and measuring respectively the total current flow through the all of the chains. In various versions, the control means also communicates with user adjustable means for increasing the intensity or dimming the light emitted from the WLEDs, and also for switching the device on and off. Preferably the control means recognizes when one or more of the WLEDs has failed and additionally causes a change of state of a further component that indicates that a fault has occurred. The further, indicating component may be, for example, a warning light which can be instantly observed, or a memory register in which a bit can be changed and stored for later analysis on connection to the control means of a lighting management system.

It will be appreciated by those skilled in the art that a device fabricated in accordance with the present invention can be controlled in a safe and reliable manner and the failures of the WLEDs used in the device can be minimized because of this operation. Furthermore, the constant and continual monitoring of the current flows through the WLED chains further mitigates against failure.

A further advantage of the device proposed herein is the uniform and relatively low power consumption throughout, for example, an aircraft which can now be achieved.

DETAILED DESCRIPTION

The following description of a lighting control device, and various embodiments thereof, is demonstrative in nature and is not intended to limit the invention or its application of uses. Although the lighting control device described herein through various illustrative examples are described primarily in the context of the passenger seat lighting, they are equally applicable to other systems and environments.

Figure 1:
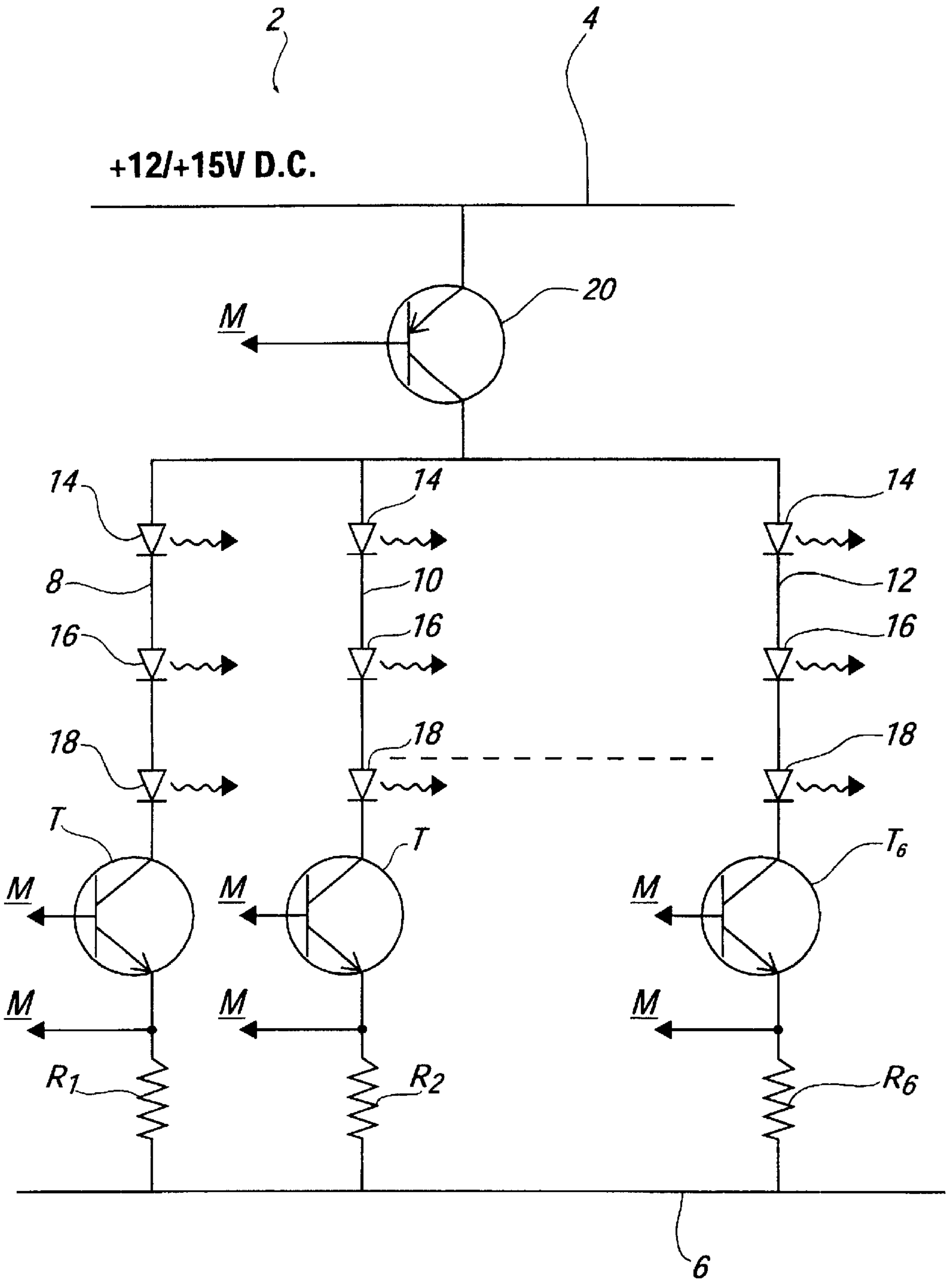
FIG. 1 shows an illustrative electronic circuit for a lighting control device.

Referring to FIG. 1, there is shown a circuit 2 for providing controllable current through a series of chained WLEDs. The circuit comprises high and low voltage lines 4, 6 between which a plurality of WLED chains, three of which are shown at 8, 10, 12 and of which, in one embodiment, there are ideally six connected in parallel. In the version of FIG. 1, each of the WLED chains is provided with three WLEDs 14, 16, 18 connected in series together with a transistor Tx, where X is the number from left to right of the particular chain, and a resistor Rx, over which there is a measurable potential drop within the particular WLED chain.

The version of FIG. 1 further includes a power transistor 20 connected between the high voltage line 4 and the parallelly connected WLED chains 8, 10, 12. The power transistor 20 provides a means of altering the total amount of current that is fed from the high voltage line 4 to all of the WLED chains. The high voltage line 4 ideally provides a potential drop over the whole circuit beneath either of 12 or 15V DC. Therefore, it will be appreciated that the overall power consumption of the device is relatively small, especially as the WLEDs 14, 16, 18 typically operate at low currents.

The circuit shown in FIG. 1 ideally controls the output light of a single WLED cluster comprising only those connected in the chains 8, 10, 12. In practice, many additional, similar circuits will be connected between the same two voltage lines 4, 6 and will provide light for a number of different seats within an aircraft or similar vehicle, for example.

The control of the currents flowing in the various parts of the circuit is effected, for example, as follows.

The potential drop across all resistors Rx is measured by suitable means and this information is fed to a microprocessor (not shown, but connections thereto are indicated by (M). The microprocessor can calculate the currents based on the value of the resistances. The microprocessor also communicates with and controls the power transistor 20, and the parallelly connected transistors Tx, and reduces or increases the current supplied to the bases of said transistors dependent on the current flowing through the resistors Rx.

The entire circuit 2 is ideally integrated on a printed circuit board (not shown) on which there is further provided a thermistor or like temperature measuring component (also not shown) which provides an indication of the operating temperature of the WLEDs to the microprocessor. Henceforth, the current supplied to all the WLEDs through the power transistor 20, and through each of the chains 8, 10, 12 can be dynamically adjusted by the microprocessor dependent on the operating temperature, the current flow through each of the chains, the total current flow, (although could be derived by the microprocessor from the total of the individual chain currents), and the instantaneous supply voltage.

The provision of a microprocessor alternatively allows for the following operations:

- control of total current through WLEDs by adjustment of base input to power transistor 20 allowing for a dimming cycle and on/off operation of the light;
- reduction of total current and/or individual chain currents as the operating temperature rises according to a pre-programmed derating curve;
- compensation for imperfections in the supply line voltage by maintaining a constant total current, known as regulation;
- the automatic reduction to zero of a particular individual chain current in the event that one of the WLEDs in that chain fails in short circuit and subsequent spreading of the total current through the other chains, known as failure compensation which can be additionally limited by temperature compensation;
- automatic compensation for failure of any particular WLED in open circuit in conjunction with current spreading through the remaining chains; and/or
- communication with a master controller on the state of health of the WLEDs and the total power consumption.

Figure 2:
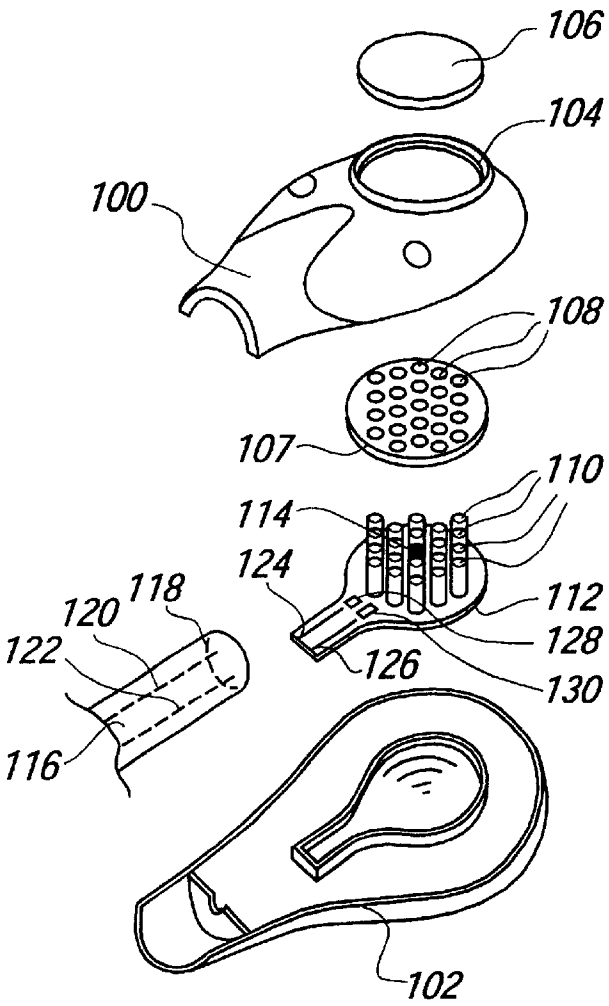
FIG. 2 is an exploded perspective view of the various components of a lighting device embodiment.
Figure 3:
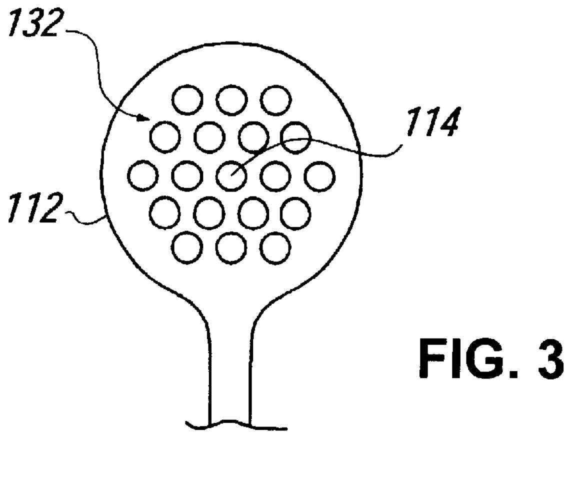
FIG. 3 is a plan view of an illustrative integrated circuit board on which is mounted an hexagonal close packed array of WLEDs.

Referring now to FIGS. 2 and 3, there is shown a schematic exploded view of some of the components that may be used in the construction of a lighting device according to the invention.

In FIG. 2, an illuminating head is assembled from two shells, a first shell 100 and a second shell 102. The first shell 100 has an aperture 104 that can receive a transparent insert 106 through which light is emitted. In use, the surface of the shell 100 in which the aperture 104 is provided will typically be directed downwardly above the lap of a user to project light thereon, and therefore, this surface is often the under surface of the device.

Within the two shells 100 and 102 is provided a black, opaque plastic insert 107, for example, having a plurality of bores 108 that at least partially receive the tips of WLEDs 110 mounted on an integrated circuit (IC) board 112. The bores 108 are provided to isolate and insulate the WLEDs from one another, to prevent the WLEDs from interfering with one another, and also to provide some lateral support for the WLEDs as the terminals by which LEDs are commonly mounted on ICs are prone to fracture. It is to be pointed out that in the embodiment shown in FIG. 2, an indicator LED 114 of conventional color (i.e. red) or alternate color (e.g. green) is provided substantially centrally within the surrounding array of WLEDs. The indicator LED 114 is also received within a substantially central bore 108 within the insert 107. The indicator LED 114, when illuminated in accordance with a modified aspect of the invention to indicate when one or more WLEDs have failed, can be seen through the transparent insert 106 notwithstanding the emission of light through said insert 106 by the remaining illuminated WLEDs. This makes it particularly easy for a person inspecting a large number of light fittings to establish whether any particular WLED has failed and thus requires replacement.

The end 118 of a flex-and-stay type member 116 is clamped within the aperture defined when the first and second shells 100 and 102 are brought together. A pair of current-carrying wires 120 and 122 provides a source of power for corresponding contacts 124 and 126 disposed at one end of the IC board 112. It is to be emphasized that the actual manner in which the WLED array is powered is not crucial to the invention, and, accordingly, persons skilled in the may be consider art alternative methods.

Also mounted on the IC board 112 in the version of FIG. 2 are microprocessor devices 128 and 130 that perform the inventive control of supplied current to the various WLED chains in the WLED array, and the particular LED indication means which operates when one or more WLEDs has failed. Other components such as thermistors to measure ambient temperature conditions may also be mounted on said IC board 112 as required by alternative specific implementations of the invention.

Referring finally to FIG. 3, there is shown a particular "hexagonal-close-packed" array 132 of WLEDs mounted on the IC board 112. This arrangement is particularly advantageous because it gives rise to a uniform and balanced light emission from the underside of the shell 100. Furthermore, these characteristics are not adversely affected when one of the WLEDs fails. Additionally, the particular indication LED 114 can be clearly seen in FIG. 3 centrally positioned within the array 132.

Figure 4:
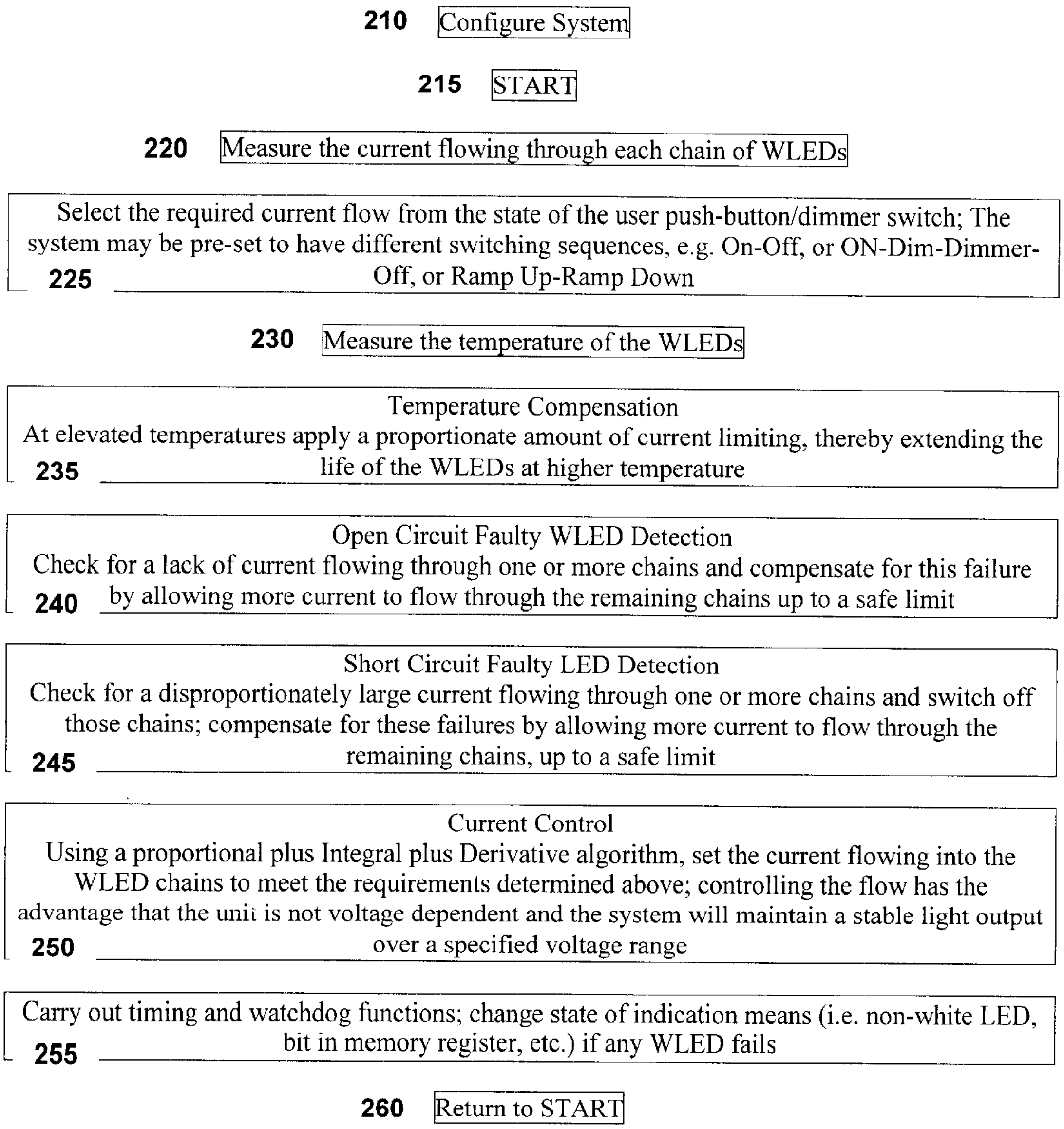
FIG. 4 is a flow chart representing an illustrative operation cycle of a microprocessor and the requirements of the program controlling the same.

Referring to FIG. 4, a flow chart represents an illustrative operation cycle of a microprocessor and the requirements of the program controlling the same.

At step 210, the system is configured.

At step 215 the program begins to run, thereby starting the operation cycle.

At step 220, the current flowing through each chain of WLEDS is measured.

The required current flow is selected from the state of a user push button/dimmer switch, for example, at step 225. In alternative versions, the system may be pre-set to have different switching sequences; for example, on-off, on-dim-dimmer-off and ramp up-ramp down.

According to step 230, the temperature of the WLEDs is measured.

Step 235 compensates for temperature. For instance, at elevated temperatures, a proportionate amount of current limiting is applied, thereby extending the life of the WLEDs at higher temperatures.

According to step 240, a check is made for a lack of current flowing through one or more chains. This failure is compensated for by allowing more current to flow through the remaining chains, up to a safe limit.

In step 245, check is made for a disproportionately large current flowing through one or more chains. Chains having a disproportionately large current flow are switched off and compensated for by allowing more current to flow through the remaining chains, up to a safe limit.

Step 250 involves current control. Using, for example, a proportional plus integral plus derivative algorithm, the current flowing into the WLED chains is set to meet requirements determined in previous steps. Controlling the current flow provides an advantage in that the unit is not voltage dependent and the system will maintain a stable light output over a specified range voltage range.

According to step 255, timing and "watchdog" functions are performed and the state of the indication means is changed (e.g., non-white light, bit in memory register, etc.) if any WLED fails.

In the step 260, the process returns to "start."

The foregoing is considered to be illustrative of the principles of the invention. Furthermore, since modifications and changes will occur to those skilled in the art without departing from the scope and spirit of the invention, it is to be understood that the foregoing does not limit the invention as expressed in the appended claims to the exact construction, implementations and versions shown and described.

Referring now to FIGS. 2 and 3 there is shown a schematic exploded view of some of the components which may be used in the construction of a working lighting device according to the invention.

An illuminating head is assembled from two shells 100 102, said first shell 100 having an aperture 104 which can receive a transparent insert 106 through which light is emitted. In use, the surface of the shell 100 in which the aperture 104 is provided will typically be directed downwardly above the lap of a user to project light thereon, and therefore this surface is often the under surface of the device.

Within the two shells is provided a usually black opaque plastic insert 107 having a plurality of bores 108 which at least partially receive the tips of WLEDs 110 mounted on an integrated circuit (IC) board 112. The bores are provided to isolate and insulate each of the WLEDs from one another, to prevent same from interfering with one another, and finally to provide some lateral support for said WLEDs as the terminals by which LEDs are commonly mounted on ICs are prone to fracture. It is to be pointed out that in the embodiment shown in FIG. 2, an indicator LED 114 of conventional colour (i.e. red) or alternate colour (e.g. green) is provided substantially centrally within the surrounding array of WLEDs and this particular LED is also received within a substantially central bore 108 within the insert 107.

Said particular LED, when illuminated in accordance with a modified aspect of the invention to indicate when one or more WLEDs have failed, can be seen through the transparent insert 106 notwithstanding the emission of light through said insert 106 by the remaining illuminated WLEDs. This makes it particularly easy for an engineer or other person inspecting a large number of light fittings to establish whether any particular WLED has failed and thus requires replacement of the cluster at some convenient time subsequently. The timing of the replacement may depend on the maintenance schedule applicable to the particular aircraft in which the device is fitted.

The end 118 of a flex-and-stay type member 116 is clamped within the aperture defined when the two shells 100, 102 are brought together and a pair of current-carrying wires 120, 122 provide a source of power for corresponding contacts 124, 126 disposed at one end of the IC board 112. It is to be emphasised that the actual manner in which the WLED array is powered is not crucial to the invention, and other methods may be considered by persons skilled in the art.

Also mounted on said IC board 112 are microprocessor devices 128, 130 which perform the inventive control of supplied current to the various WLED chains which constitute the array, and the particular LED indication means which operates when one or more WLEDs has failed. Other components such as thermistors to measure ambient temperature conditions may also be mounted on said IC board 112 as required by the invention.

Referring finally to FIG. 3, there is shown the particular "hexagonal-close-packed" array 132 of WLEDs mounted on said IC board 112. This arrangement is most desirable because it gives rise to a uniform and balanced light emission from the underside of said shell 100, and these characteristics are not adversely affected when one of the WLEDs fails. Additionally, the particular indication led 114 can be clearly seen in FIG. 3 centrally positioned within the array 132.

What is claimed is:

1. A lighting device comprising:

a cluster of WLEDs, at least some of which WLEDs are chained in parallel between a pair of lines that apply a voltage across the WLED chains;

first current altering means that can be controlled to alter the total current delivered to the individual WLED chains;

second current altering means provided in each WLED chain, the second current altering means being controllable to alter the current flow in that WLED chain;

current measuring means in each WLED chain; and control means communicating with the current measuring means within in each WLED chain, the control means being capable of controlling at least one of (i) the first current altering means and (ii) at least one of the second current altering means in response to variations in measured current in the individual WLED chains.

2. The lighting device according to claim 1 further comprising primary current measuring means between the voltage lines and the WLED chains that measures the instantaneous total current being drawn by all of the individual WLED chains, and wherein the control means communicates with the primary current measuring means.

3. The lighting device according to claim 2 wherein the control means is a microprocessor operating under the control of a computer program.

4. The lighting device according to claim 3 wherein each WLED chain comprises three WLEDs connected in series.

5. The lighting device according to claim 4 wherein a cluster of WLEDs comprises six WLED chains connected in parallel.

6. The lighting device according to claim 5 wherein the current measuring means in each WLED chain comprises a resistor connected in series with the serially connected WLEDs of that chain.

7. The lighting device according to claim 6 wherein the first and second current altering means comprise transistors.

8. The lighting device according to claim 7 further comprising temperature measurement means in communication with the microprocessor such that the microprocessor adjusts the current flow through the WLED chains in response to changes in temperature.

9. The lighting device according to claim 8 wherein the microprocessor dynamically adjusts the current flows through the WLED chains such that the current flow therethrough is substantially uniform and is devoid of discontinuities irrespective of at least one of (i) the operating temperature and (ii) the failure of one or more of the WLEDs.

10. The lighting device according to claim 9 wherein the control means, voltage lines and chained, serially connected WLEDs are integrated on a single circuit.

11. The lighting device according to claim 10 wherein the device is used to provide light for an aircraft seat.

12. The lighting device according to claim 11 further comprising an indication means, and wherein the microprocessor communicates with the indication means and changes the state of the indication means when the microprocessor detects that one or more of the WLEDs has failed.

13. The lighting device according to claim 12 further comprising gate means in series with the indication means, and wherein the indication means comprises light means that emit a light other than white, the gate means being in communication with the microprocessor between the voltage lines, the microprocessor activating the gate means to allow current to flow through the light means to illuminate the light means in response to the failure of at least one WELD.

14. The lighting control device according to claim 13 wherein the indication means is included in a remote indicator panel.

15. The lighting control device according to claim 14 wherein the indicator means is one or more bits in a memory register.

16. A lighting device comprising:

a control means for controlling current flow in a plurality of individual parallel connected WLED chains arranged between a pair of voltage lines;

first current altering means situated between one of the voltage lines and the individual parallel connected chains for altering the total current delivered to the individual parallel connected chains, each of said individual parallel connected chains having at least one WLED connected therein; and second current altering means and current measuring means situated in each WLED chain with the at least one WLED of that chain, the control means being adapted to communicate with the current measuring means in each individual parallel connected chain and capable of controlling at least one of (i) the first current altering means and (ii) at least one of the second current altering means in response to variations in measured current in the individual chains.

17. A control means according to claim 16 characterized in that the control means also communicates with user adjustable means for increasing or reducing the intensity of the light emitted from the WLEDs, and also for switching the device on and off.

18. A control means according to claim 8 characterized in that the control means recognizes when one or more of the WLEDs has failed and additionally causes a change of state of an indication means which indicates that a fault has occurred.

* * * * *